United States Patent (12)
Hsu

(10) Patent No.: US 9,072,172 B2
(45) Date of Patent: Jun. 30, 2015

(54) AUXILIARY DEVICE FOR MOBILE ELECTRONIC APPARATUS

(71) Applicant: PADTRON TECHNOLOGY L.L.C., Mission Viejo, CA (US)

(72) Inventor: Mao-Jung Hsu, Taichung (TW)

(*) Notice: Subject to any disclaimer, the term of this patent is extended or adjusted under 35 U.S.C. 154(b) by 35 days.

(21) Appl. No.: 13/800,747

(22) Filed: Mar. 13, 2013

(65) Prior Publication Data

US 2013/0273983 A1    Oct. 17, 2013

(30) Foreign Application Priority Data

Apr. 16, 2012    (TW) .............................. 101207023 U

(51) Int. Cl.

| | |
|---|---|
| *H05K 5/00* | (2006.01) |
| *H04B 1/3888* | (2015.01) |
| *G06F 1/16* | (2006.01) |
| *H04M 1/18* | (2006.01) |
| *H04M 1/725* | (2006.01) |
| *H01M 10/42* | (2006.01) |
| *H04M 1/02* | (2006.01) |
| *H04M 1/04* | (2006.01) |

(52) U.S. Cl.
CPC ......... *H05K 5/0086* (2013.01); *H01M 2220/30* (2013.01); *H01M 10/4257* (2013.01); *H04B 1/3888* (2013.01); *G06F 1/1626* (2013.01); *G06F 1/1632* (2013.01); *H04M 1/0262* (2013.01); *H04M 1/04* (2013.01); *H04M 1/185* (2013.01); *H04M 1/72527* (2013.01)

(58) Field of Classification Search
USPC ........................................ 455/575.8; 320/109
See application file for complete search history.

(56) References Cited

U.S. PATENT DOCUMENTS

| | | | | |
|---|---|---|---|---|
| 5,535,437 | A * | 7/1996 | Karl et al. .................. | 455/575.1 |
| 6,630,811 | B1 * | 10/2003 | Gioscia ......................... | 320/107 |
| 2004/0097256 | A1 * | 5/2004 | Kujawski .................... | 455/550.1 |
| 2005/0181745 | A1 * | 8/2005 | Wood et al. .................. | 455/90.3 |
| 2009/0052654 | A1 * | 2/2009 | Hyun et al. ............. | 379/433.11 |
| 2012/0306431 | A1 * | 12/2012 | Li et al. ......................... | 320/101 |
| 2013/0017788 | A1 * | 1/2013 | Norair et al. ................. | 455/41.2 |
| 2013/0088815 | A1 * | 4/2013 | Hu et al. .................. | 361/679.01 |
| 2013/0206844 | A1 * | 8/2013 | Chen et al. .................... | 235/492 |

* cited by examiner

*Primary Examiner* — Daniel Lai

(57) ABSTRACT

An auxiliary device for mobile electronic apparatus includes an electrically insulative housing for accommodation a mobile electronic apparatus, an electrical connector slidably coupled to the electrically insulative housing and movable between an extended position to electrically connect a card-edge connector thereof to the accommodated mobile electronic apparatus in the electrically insulative housing and a received position to electrically disconnect the card-edge connector from the accommodated mobile electronic apparatus, and a back cover detachably mounted in a back side of the electrically insulative housing to electrically connect a storage battery cell to the electrical connector for charging the accommodated mobile electronic apparatus in the electrically insulative housing.

4 Claims, 8 Drawing Sheets

AUXILIARY DEVICE FOR MOBILE ELECTRONIC APPARATUS

This application claims the priority benefit of Taiwan patent application number 101207023, filed on Apr. 16, 2012.

BACKGROUND OF THE INVENTION

1. Field of the Invention

The present invention relates to auxiliary devices for mobile electronic apparatus and more particularly, to such an auxiliary device for mobile electronic apparatus, which is practical for accommodating and charging a mobile electronic apparatus, and linking the accommodated mobile electronic apparatus to an external electronic equipment for charging or communication.

2. Description of the Related Art

With the rapid development of computer technology, notebook computers, tablet computers, smart phones, PDAs and many other mobile electronic devices have been created to meet different application requirements and to attract people of all ages. People of different ages may prefer different kinds of mobile electronic apparatuses. Nowadays, tablet computers and smart phones become more widespread. Almost everyone has one or multiple mobile electronic apparatuses. People can do word processing on a tablet computer. In addition to the function of making calls, a smart phone can be used to connect to the Internet for Internet communications, shopping, chatting, information searching, free from the restrictions of the time and place. A mobile electronic apparatus has become an integral part of the life of many people. The portable convenience of tablet computers and smart phones meets the needs in our daily lives. A tablet computer, smart phone or any other mobile electronic apparatus must be equipped with a power source to provide the necessary working voltage. Commercial smart phones commonly have a built-in battery to provide the necessary working voltage. When the battery power of the built-in battery cell of a smart phone is low or used up, a charging cable can be used to connect the electrical plug hole (power jack) of the smart phone to an external power source, enabling the built-in battery cell of the smart phone to be charged.

Further, a smart phone or tablet computer is a high-priced electronic product. A smart phone/tablet computer user usually will use a protective covering to accommodate his or her smart phone/tablet computer, protecting the smart phone/tablet computer against scratching or impact. When a smart phone/tablet computer is accommodated in a protective covering, the electrical plug hole (power jack) of the smart phone/tablet computer is blocked by the protective covering. When going to charge the smart phone/tablet computer, the user must remove the protective covering from the smart phone/tablet computer for allowing connection of a charging cable to the electrical plug hole (power jack) of the smart phone/tablet computer. After the charging operation is done, the user needs to attach the protective covering to the smart phone/tablet computer again. However, frequently removing and attaching the protective covering may cause the surface of the smart phone/tablet computer or the snap connection structure of the protective covering to be accidentally damaged.

Therefore, it is desirable to provide a mobile electronic apparatus protective covering that effectively protects the accommodated mobile electronic apparatus and allows charging of the accommodated mobile electronic apparatus without detaching the protective covering.

SUMMARY OF THE INVENTION

The present invention has been accomplished under the circumstances in view. It is therefore the main object of the present invention to provide an auxiliary device for mobile electronic apparatus, which is adapted to accommodate a mobile electronic apparatus, and to charge the accommodated mobile electronic apparatus either directly with a built-in battery or by means of an external battery charger, or to link the accommodated mobile electronic apparatus to an external electronic equipment for charging or communication.

To achieve this and other objects of the present invention, an auxiliary device for mobile electronic apparatus comprises an electrically insulative housing, which comprises an accommodation open chamber adapted to accommodate a predetermined mobile electronic apparatus, a bottom block located at the bottom side of the accommodation open chamber, a bottom-open storage chamber defined in the bottom block, and a sliding slot cut through the bottom block in communication between the accommodation open chamber and the bottom-open storage chamber, an electrical connector, which comprises a card-edge connector located at the top side thereof and a plurality of metal contacts extended from the card-edge connector and arranged at a lower back side thereof and, which is coupled to the sliding slot of the electrically insulative housing and movable along the sliding slot between an extended position to electrically connect the card-edge connector to the accommodated mobile electronic apparatus in the accommodation open chamber and a received position to disconnect the card-edge connector from the accommodated mobile electronic apparatus in the accommodation open chamber, and a back cover, which is detachably mounted in the back side of the accommodation open chamber of the electrically insulative housing, comprising a hidden compartment, at least one battery cell mounted in the hidden compartment, a plurality of metal contacts that are respectively attached to the metal contacts of the electrical connector after mounting of the back cover in the back side of the accommodation open chamber of the electrically insulative housing, and electric wires electrically connecting the at least one battery cell to the metal contacts of the back cover for charging the accommodated mobile electronic apparatus after the electrical connector is moved to the extended position.

Further, the accommodation open chamber of the electrically insulative housing can be configured to accommodate a smart phone or tablet computer. By means of moving the electrical connector to the received position, an assigned mobile electronic apparatus can be accommodated in the accommodation open chamber of the electrically insulative housing in the intact condition. After accommodation of the assigned mobile electronic apparatus in the accommodation open chamber of the electrically insulative housing, the electrical connector is moved to the extended position to electrically connect the card-edge connector to the accommodated mobile electronic apparatus. Thus, the assigned mobile electronic apparatus can be mounted in or detached from the auxiliary device conveniently.

Further, after removable of the back cover from the electrically insulative housing, the electrically insulative housing with the electrical connector and the accommodated mobile electronic apparatus can be inserted into a charging slot of a battery charger for enabling the battery charger to charge the accommodated mobile electronic apparatus, or to link the accommodated mobile electronic apparatus to an external electronic equipment for charging or communication.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Figure 1:
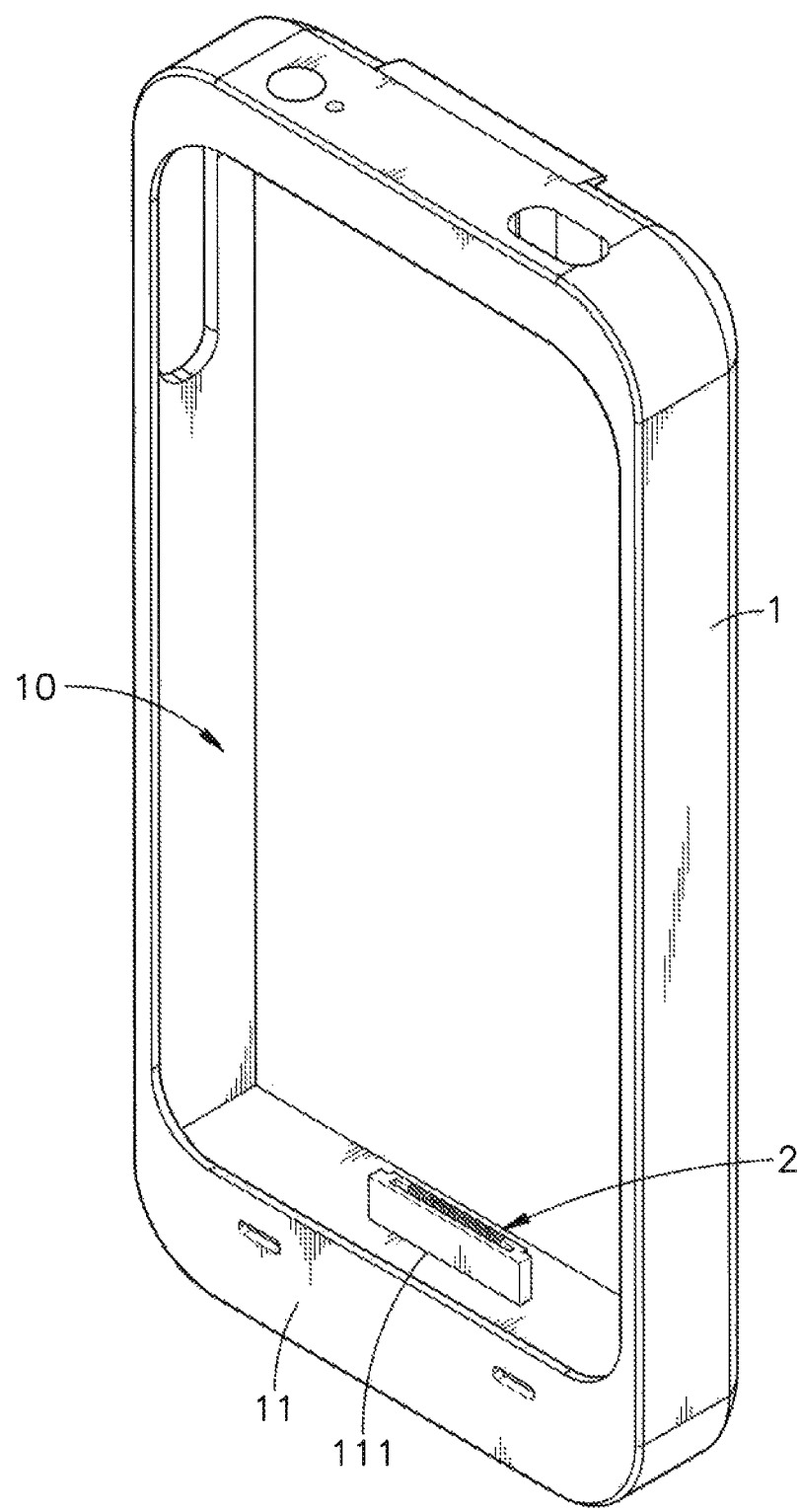
FIG. 1 is an oblique front elevational view of an auxiliary device for mobile electronic apparatus in accordance with the present invention.
Figure 2:
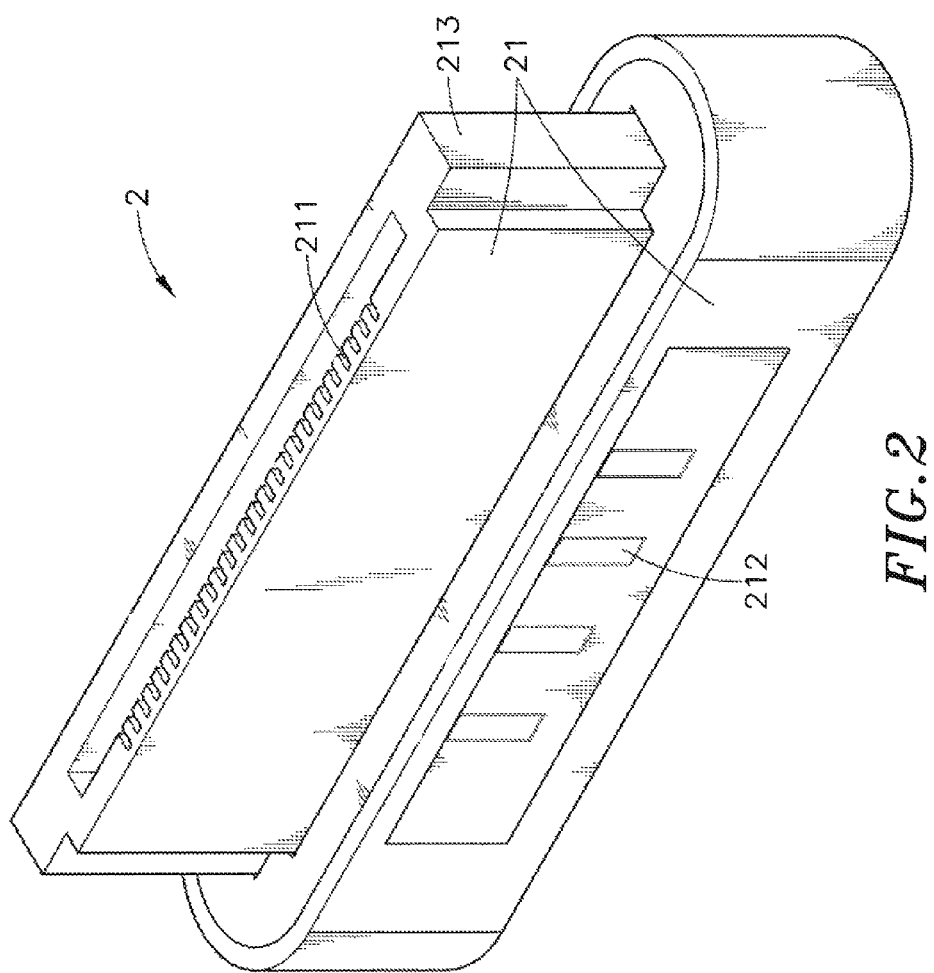
FIG. 2 is an oblique front elevational view of the electrical connector of the auxiliary device for mobile electronic apparatus in accordance with the present invention.
Figure 3:
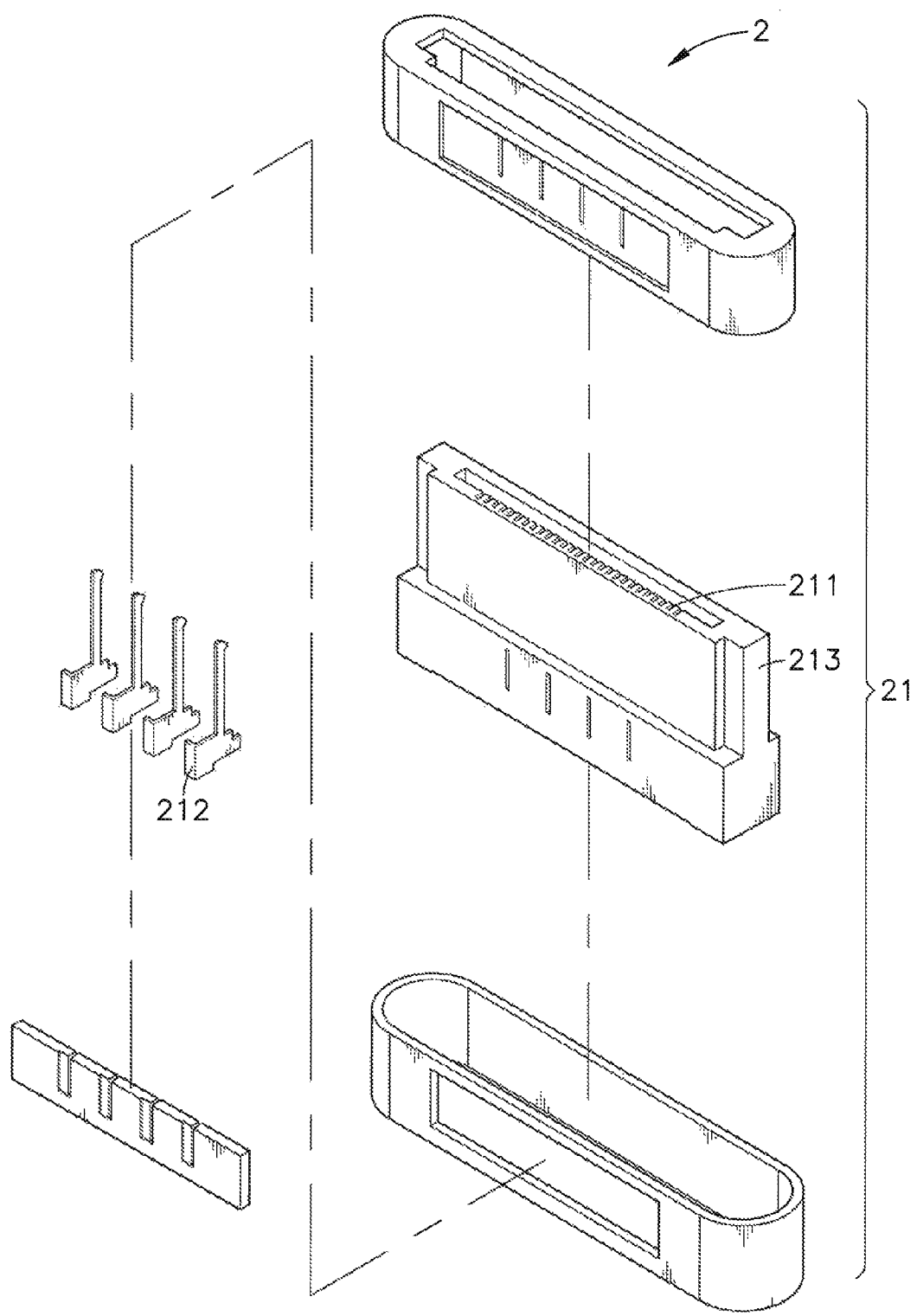
FIG. 3 is an exploded view of the auxiliary device for mobile electronic apparatus in accordance with the present invention.
Figure 4:
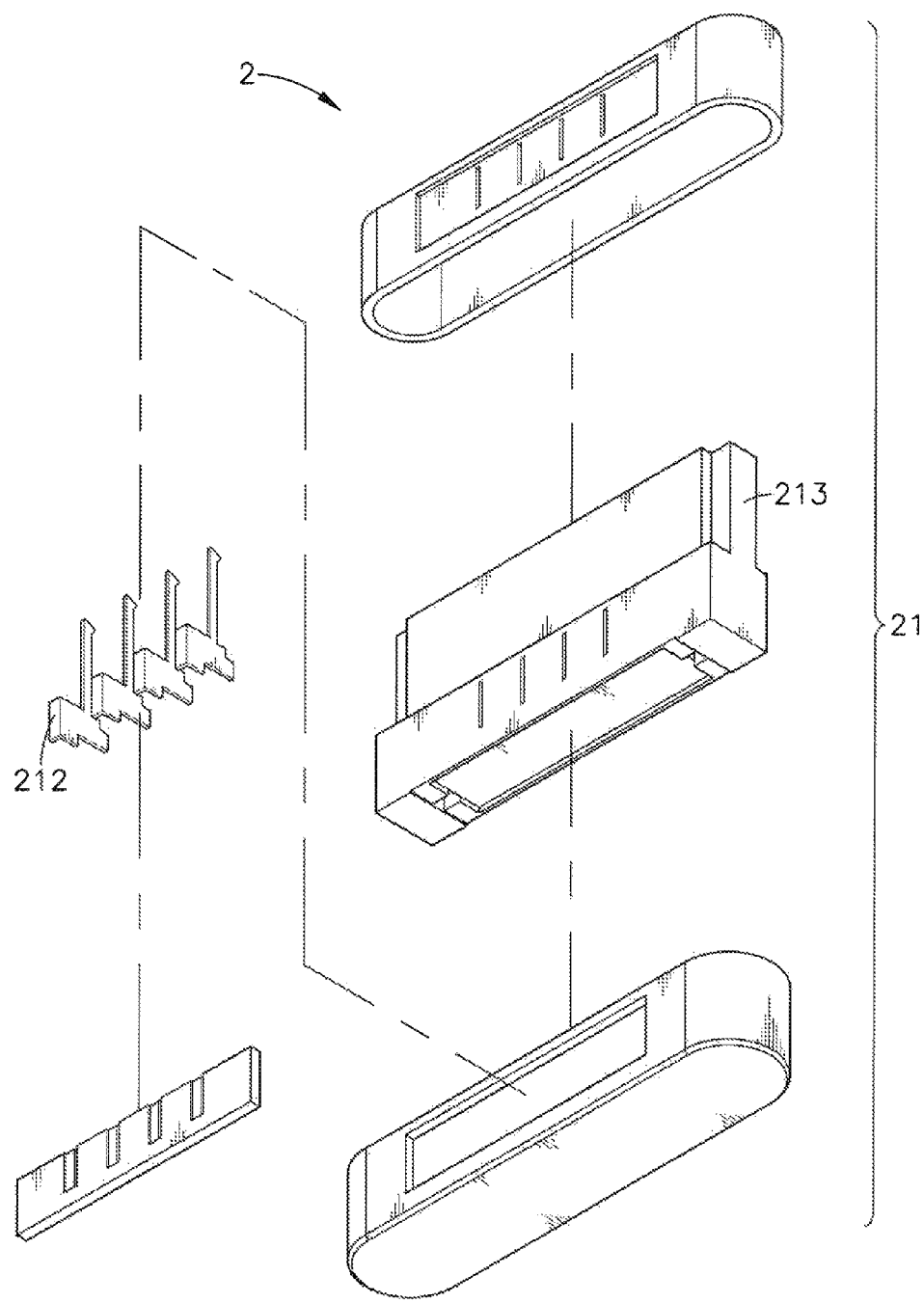
FIG. 4 corresponds to FIG. 3 when viewed from another angle.
Figure 5:
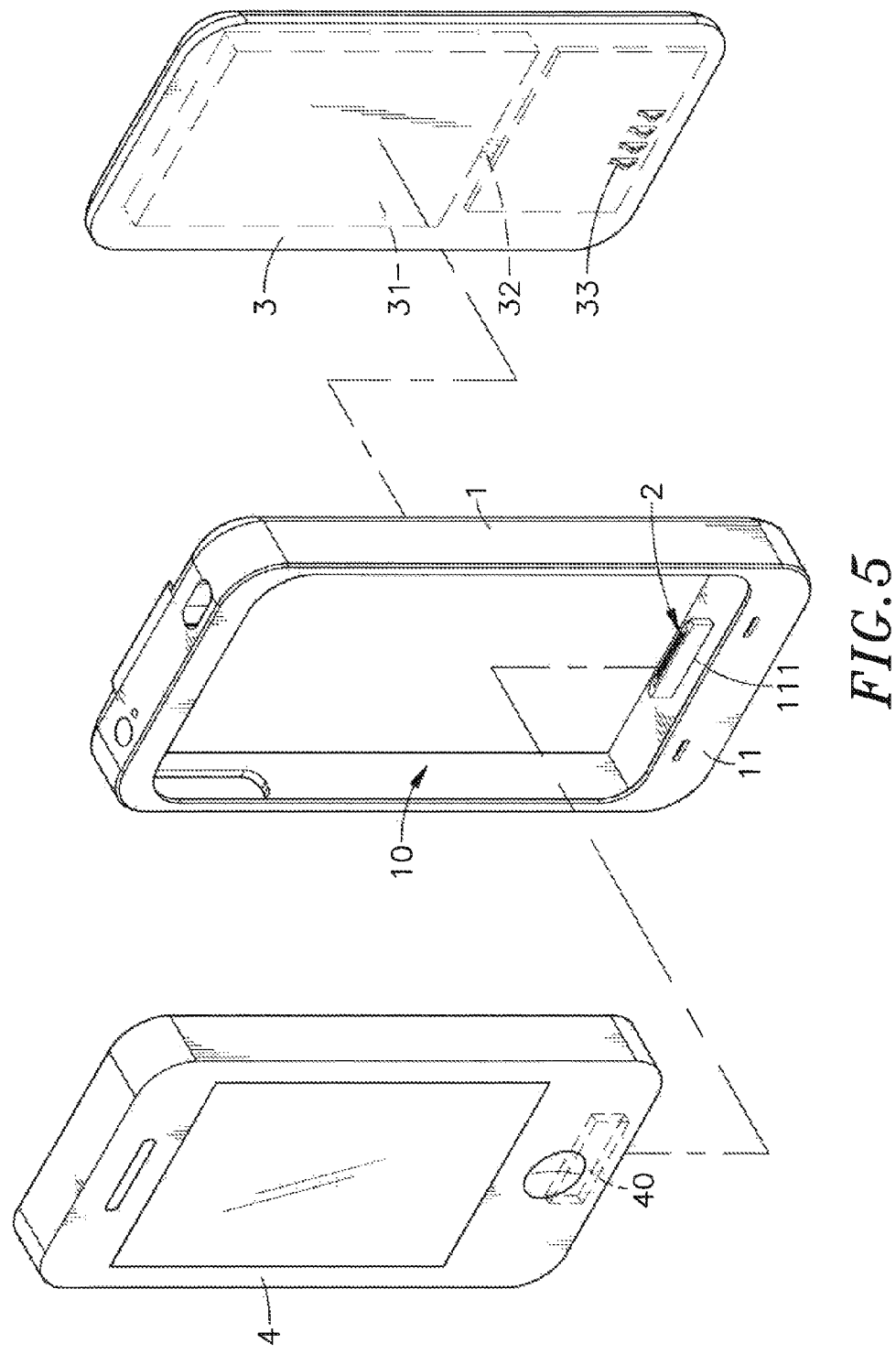
FIG. 5 is a schematic exploded view of the auxiliary device in accordance with the present invention, illustrating the back cover removed from the electrically insulative housing and the electrical connector in the extended position before insertion of an assigned mobile electronic apparatus in the accommodation chamber of the electrically insulative housing.

Referring to FIGS. 1-5, an auxiliary device for mobile electronic apparatus in accordance with the present invention is shown. The auxiliary device comprises an electrically insulative housing 1, an electrical connector 2 detachably mounted in the electrically insulative housing 1, and a back cover 3 detachably mounted in the back side of the electrically insulative housing 1.

The electrically insulative housing 1 is a hollow frame shell defining an accommodation open chamber 10, a plurality of retaining grooves 101 respectively disposed in opposing top and bottom sides of the accommodation open chamber 10, a bottom block 11 located at a bottom side of the accommodation open chamber 10, a bottom-open storage chamber 110 defined in the bottom block 11, and a sliding slot 111 cut through the bottom block 11 in communication between the accommodation open chamber 10.

The electrical connector 2 is configured subject to one of the specifications of USB, Mini USB and Micro USB, comprising an electrically insulative base member 21, a card-edge connector 211 (that can be made in the form of male plug type or female plug type) mounted in a top side of the electrically insulative base member 21, a plurality of metal contacts 212 extended from the card-edge connector 211 and arranged at a lower back side of the electrically insulative base member 21, and two locating blocks 213 respectively protruded from two opposite lateral sides of the electrically insulative base member 21.

The back cover 3 comprises a hidden compartment 30, at least one battery cell 31 mounted in the hidden compartment 30, a plurality of metal contacts 33 protruded over a front wall thereof and arranged near a bottom side thereof, and electrical wires 32 electrically connecting the metal contacts 33 to opposing positive and negative terminals of the battery cell 31.

When assembling the auxiliary device, the electrically insulative base member 21 of the electrical connector 2 is inserted into the sliding slot 111 in the bottom block 11 at the bottom side of the accommodation open chamber 10 of the electrically insulative housing 1 to the extent where the card-edge connector 211 is suspended in the accommodation open chamber 10 and the two locating blocks 213 of the electrical connector 2 respective stopped inside the bottom-open storage chamber 110 in the bottom block 11 to prohibit the electrically insulative base member 21 from escaping out of the bottom block 11. At this time, the metal contacts 212 of the electrical connector 2 are exposed to the outside of the bottom block 11. Thereafter, mount the back cover 3 in the rear side of the accommodation open chamber 10 of the electrically insulative housing 1 to force the opposing top and bottom edges of the back cover 3 into engagement with the retaining grooves 101 of the electrically insulative housing 1 respectively and to abut the metal contacts 33 of the back cover 3 against the metal contacts 212 of the electrical connector 2 respectively. Thus, the electrically insulative housing 1, the electrical connector 2 and the back cover 3 are assembled, forming the desired auxiliary device.

Figure 6:
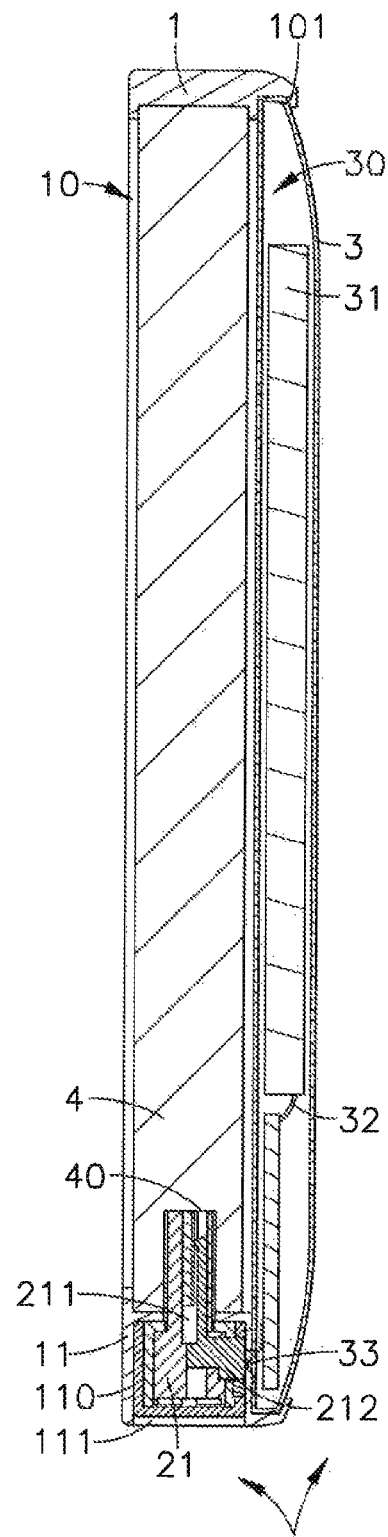
FIG. 6 is a sectional side view of the auxiliary device for mobile electronic apparatus in accordance with the present invention, illustrating an assigned mobile electronic apparatus accommodated in the accommodation chamber of the electrically insulative housing and the electrical connector inserted into the bottom electrical plug hole of the accommodated mobile electronic apparatus.
Figure 7:
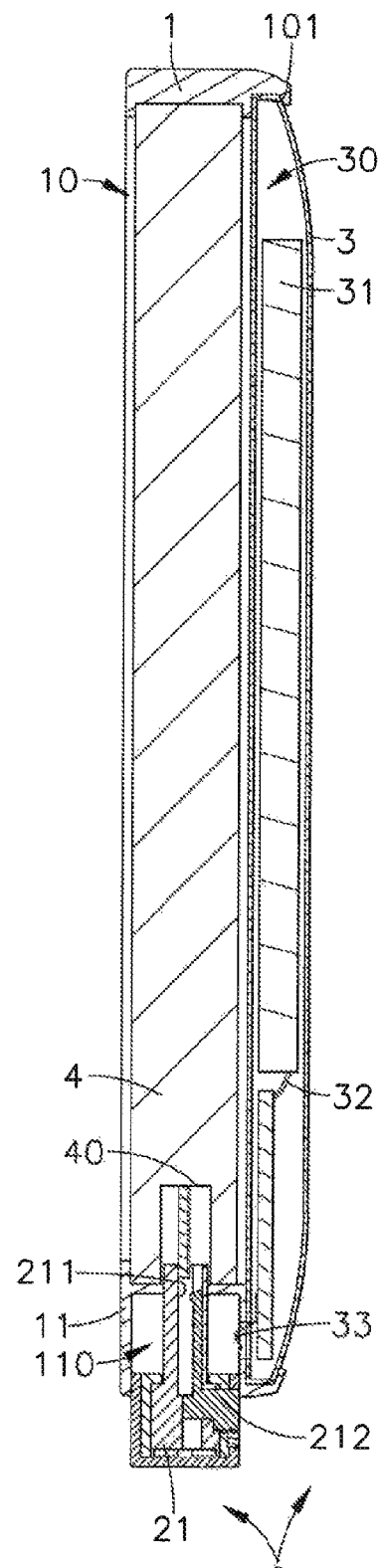
FIG. 7 corresponds to FIG. 6, illustrating the electrical connector in the received position.
Figure 8:
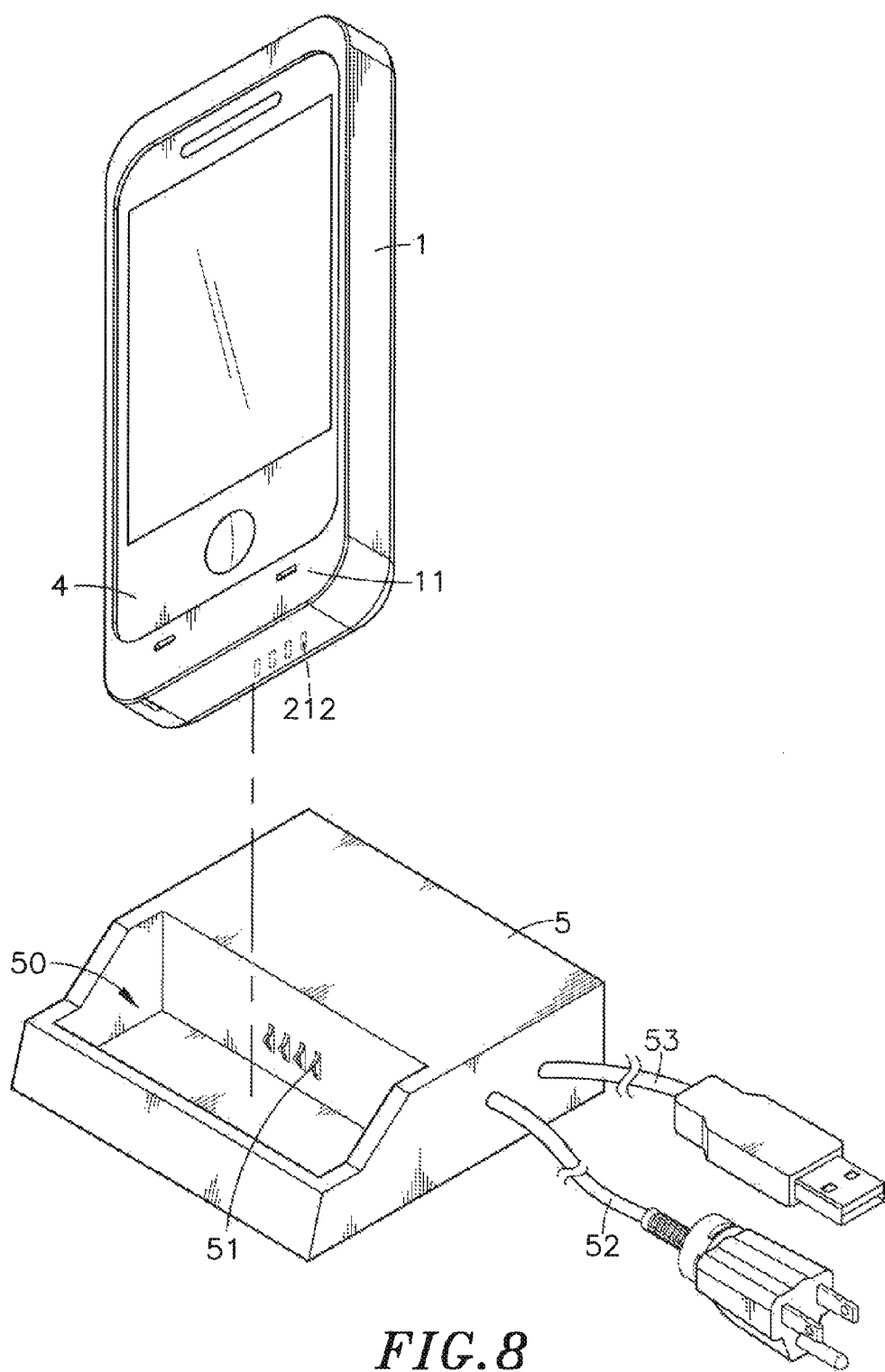
FIG. 8 is an exploded view of the present invention, illustrating another application example of the auxiliary device.

Referring to FIGS. 6-8 and FIGS. 1 and 5 again, the accommodation open chamber 10 of the electrically insulative housing 1 is adapted to accommodate a mobile electronic apparatus 4 (for example, smart phone or tablet PC). After the auxiliary device is assembled, the electrical connector 2 can be moved along the sliding slot 111 between an extended position where the card-edge connector 211 is suspended in the accommodation open chamber 10 (see FIGS. 5 and 6) and a received position where the card-edge connector 211 is received in the bottom-open storage chamber 110 inside the bottom block 11 (see FIG. 7). When the electrical connector 2 is in the received position, an assigned mobile electronic apparatus 4 can be accommodated in the accommodation open chamber 10 of the electrically insulative housing 1 to keep a bottom electrical plug hole 40 (power jack) of the accommodated mobile electronic apparatus 4 in alignment with the sliding slot 111 in the bottom block 11 at the bottom side of the accommodation open chamber 10 of the electrically insulative housing 1. After accommodation of the mobile electronic apparatus 4 in the accommodation open chamber 10 of the electrically insulative housing 1, move the electrical connector 2 to the extended position to insert the card-edge connector 211 into the bottom electrical plug hole 40 (power jack) of the accommodated mobile electronic apparatus 4, enabling the battery power supply to be transmitted from the battery cell 31 in the hidden compartment 30 of the back cover 3 through the electrical wires 32 and metal contacts 33 of the back cover 3 and the metal contacts 212 and card-edge connector 211 of the electrical connector 2 to the bottom electrical plug hole 40 (power jack) of the accommodated mobile electronic apparatus 4 to charge the battery (not shown) of the accommodated mobile electronic apparatus 4.

Further, as shown in FIG. 8, after removal of the back cover 3 from the electrically insulative housing 1 of the auxiliary device, the auxiliary device with the accommodated mobile electronic apparatus 4 can be inserted into a charging slot 50 of a battery charger 5 to abut the metal contacts 212 of the electrical connector 2 against respective metal contacts 51 of the battery charger 5. At this time, a power cable 52 of the battery charger 5 can be connected to an electrical outlet to obtain city power supply for charging the accommodated mobile electronic apparatus 4. Alternatively, a power signal cable 53 of the battery charger 5 can be connected to a port of an external electronic equipment (computer, notebook or tablet PC) to establish connection between the accommodated mobile electronic apparatus 4 and the external electronic equipment, enabling the external electronic equipment to charge the battery of the accommodated mobile electronic apparatus 4, or to communicate with the accommodated mobile electronic apparatus 4.

Further, the size of the accommodation open chamber 10 of the electrically insulative housing 1 can be variously embodied, i.e., the accommodation open chamber 10 of the electrically insulative housing 1 can be configured to accommodate one specific commercial mobile electronic apparatus 4. An assigned mobile electronic apparatus 4 can be directly accommodated in the accommodation open chamber 10 of the electrically insulative housing 1 in the intact condition. After accommodation of an assigned mobile electronic apparatus 4 in the accommodation open chamber 10 of the electrically insulative housing 1, the user still can operate the accommodated mobile electronic apparatus 4 normally.

The above description simply indicates one embodiment of the present invention, and is not intended to limit the invention to the precise form disclosed. By means of using the accommodation open chamber 10 of the electrically insulative housing 1 to accommodate an assigned mobile electronic apparatus 4 and moving the electrical connector 2 in the bottom block 11 of the electrically insulative housing 1 to insert the card-edge connector 211 of the electrical connector 2 into the bottom electrical plug hole 40 (power jack) of the accommodated mobile electronic apparatus 4, the battery power supply of the battery cell 31 in the hidden compartment 30 of the back cover 3 can be transmitted through the electrical wires 32 and metal contacts 33 of the back cover 3 and the metal contacts 212 and card-edge connector 211 of the electrical connector 2 to the bottom electrical plug hole 40 (power jack) of the accommodated mobile electronic apparatus 4 to charge the battery (not shown) of the accommodated mobile electronic apparatus 4. Further, after removal of the back cover 3 from the electrically insulative housing 1 of the auxiliary device, the auxiliary device with the accommodated mobile electronic apparatus 4 can be inserted into the charging slot 50 of a battery charger 5, enabling the battery charger 5 to charge the accommodated mobile electronic apparatus 4 with city power supply or the power supply of an external electronic equipment, or to link the accommodated mobile electronic apparatus 4 to the external electronic equipment.

During application, the auxiliary device for mobile electronic apparatus provides the following advantages and features:

1. Subject to the sliding coupling arrangement between the sliding slot 110 in the bottom block 11 of the electrically insulative housing 1 and the electrical connector 2, the electrical connector 2 can be moved between a received position where an assigned mobile electronic apparatus 4 can be accommodated in to the electrically insulative housing 1, and an extended position where the electrical connector 2 is inserted into a bottom electrical plug hole 40 (power jack) of the accommodated mobile electronic apparatus 4 for charging or signal transmission.
2. The back cover 3 can be attached to the electrically insulative housing 1 and electrically connected to the electrical connector 2 to charge the accommodated mobile electronic apparatus 4; alternatively, the back cover 3 can be removed from the electrically insulative housing 1 for allowing the electrically insulative housing 1 and the electrical connector 2 to be inserted with the accommodated mobile electronic apparatus 4 into a battery charger 5 so that the battery charger 5 can charge the accommodated mobile electronic apparatus 4 with city power supply or link the accommodated mobile electronic apparatus 4 to an external electronic equipment for charging or communication.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An auxiliary device for mobile electronic apparatus, comprising:

an electrically insulative housing comprising an accommodation open chamber configured to accommodate a predetermined mobile electronic apparatus, a bottom block located at a bottom side of said accommodation open chamber, a bottom-open storage chamber defined in said bottom block, and a sliding slot cut through said bottom block in communication between said accommodating open chamber and said bottom-open storage chamber;

an electrical connector slidably coupled to said sliding slot of said electrically insulative housing, said electrical connector comprising an electrically insulative base member which is movable along said sliding slot of said electrically insulative housing, a card-edge connector located at a top side thereof and a plurality of metal contacts extended from said card-edge connector and arranged at a lower back side thereof, said electrical connector being movable along said sliding slot between an extended position to electrically connect said card-edge connector to the accommodated mobile electronic apparatus in said accommodation open chamber and a received position to disconnect said card-edge connector from the accommodated mobile electronic apparatus in said accommodation open chamber; and a back cover detachably mounted in a back side of said accommodation open chamber of said electrically insulative housing, said back cover comprising a hidden compartment, at least one battery cell mounted in said hidden compartment, a plurality of metal contacts that are respectively attached to the metal contacts of said electrical connector after mounting of said back cover in the back side of said accommodation open chamber of said electrically insulative housing, and electric wires electrically connecting said at least one battery cell to the metal contacts of said back cover.

2. The auxiliary device for mobile electronic apparatus as claimed in claim 1, wherein said accommodating open chamber of said electrically insulative housing is configured to accommodate a smart phone.

3. The auxiliary device for mobile electronic apparatus as claimed in claim 1, wherein said accommodating open chamber of said electrically insulative housing is configured to accommodate a tablet computer.

4. The auxiliary device for mobile electronic apparatus as claimed in claim 1, wherein said card-edge connector of said electrical connector is configured subject to one of the specifications of USB, mini USB and Micro USB.

* * * * *